(12) United States Patent
Khoueir et al.

(10) Patent No.: US 9,378,830 B2
(45) Date of Patent: Jun. 28, 2016

(54) PARTIAL REPROGRAMMING OF SOLID-STATE NON-VOLATILE MEMORY CELLS

(71) Applicant: Seagate Technology LLC, Cupertino, CA (US)

(72) Inventors: Antoine Khoueir, Apple Valley, MN (US); Varun Voddi, Shakopee, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 78 days.

(21) Appl. No.: 13/943,441

(22) Filed: Jul. 16, 2013

(65) Prior Publication Data

US 2015/0023097 A1 Jan. 22, 2015

(51) Int. Cl.
*G11C 16/12* (2006.01)
*G11C 16/14* (2006.01)
*G11C 16/10* (2006.01)
*G11C 11/56* (2006.01)
*G11C 16/04* (2006.01)
*G11C 16/34* (2006.01)
*G11C 13/00* (2006.01)

(52) U.S. Cl.
CPC ............. *G11C 16/14* (2013.01); *G11C 11/5628* (2013.01); *G11C 16/0483* (2013.01); *G11C 16/10* (2013.01); *G11C 16/3431* (2013.01); *G11C 13/0033* (2013.01); *G11C 13/0069* (2013.01)

(58) Field of Classification Search
CPC ........ G11C 7/00; G11C 13/0069; G11C 16/04; G11C 16/10; G11C 16/14; G11C 16/3418; G11C 16/3431; G11C 11/5628; G11C 16/0483
USPC .................. 365/185.22, 222, 185.09, 185.03
See application file for complete search history.

(56) References Cited

U.S. PATENT DOCUMENTS

| | | | |
|---|---|---|---|
| 6,343,033 B1 * | 1/2002 | Parker ...................... | 365/185.19 |
| 6,424,569 B1 * | 7/2002 | Parker et al. ............. | 365/185.18 |
| 6,751,146 B1 * | 6/2004 | Wang et al. ................ | 365/222 |
| 7,184,307 B2 | 2/2007 | Lee | |
| 7,325,090 B2 | 1/2008 | Ronen | |
| 8,787,080 B2 * | 7/2014 | Sommer et al. .......... | 365/185.03 |
| 8,938,655 B2 * | 1/2015 | Hamilton et al. ............. | 714/763 |
| 9,053,793 B2 * | 6/2015 | Kim | |
| 2009/0161466 A1 * | 6/2009 | Hamilton et al. ............. | 365/222 |

(Continued)

FOREIGN PATENT DOCUMENTS

JP  2008-181628 A  8/2008
JP  2009-536423 A  10/2009

(Continued)

*Primary Examiner* — Han Yang
*Assistant Examiner* — Xiaochun L Chen
(74) *Attorney, Agent, or Firm* — Hall Estill Attorneys at Law (57) ABSTRACT

Method and apparatus for managing data in a memory, such as a flash memory array. In accordance with some embodiments, data are written to a set of solid-state non-volatile memory cells so that each memory cell in the set is written to an associated initial programmed state. Drift in the programmed state of a selected memory cell in the set is detected, and the selected memory cell is partially reprogrammed to return the selected memory cell to the associated initial programmed state.

20 Claims, 5 Drawing Sheets

(56) References Cited

U.S. PATENT DOCUMENTS

2012/0268990 A1* 10/2012 Sommer et al. .......... 365/185.03
2013/0163333 A1* 6/2013 Kim .......................... 365/185.12
2014/0101371 A1* 4/2014 Nguyen et al. ................ 711/103
2014/0201437 A1* 7/2014 Endres .......................... 711/112

FOREIGN PATENT DOCUMENTS

| JP | 2010-039983 A | 2/2010 |
| KR | 10-2000-0065145 | 11/2000 |
| WO | 2009/042298 A1 | 4/2009 |

* cited by examiner

PARTIAL REPROGRAMMING OF SOLID-STATE NON-VOLATILE MEMORY CELLS

SUMMARY

Various embodiments of the present disclosure are generally directed to the management of data in a memory, such as in a flash memory array.

In accordance with some embodiments, data are written to a set of solid-state non-volatile memory cells so that each memory cell in the set is written to an associated initial programmed state. Drift in the programmed state of a selected memory cell in the set is detected, and the selected memory cell is partially reprogrammed to return the selected memory cell to the associated initial programmed state.

These and other features which characterize various embodiments can be understood in view of the following detailed discussion and the accompanying drawings.

DETAILED DESCRIPTION

The present disclosure generally relates to managing data stored in a memory module, such as but not limited to a flash memory array of a data storage device.

A wide variety of non-volatile data storage memories are known in the art. Some non-volatile memories take the form of solid-state memory cells, such as flash memory, resistive random access memory (RRAM), spin-torque transfer random access memory (STRAM), phase change random access memory (PCRAM), etc.

These and other types of memory cells take a semiconductor construction and store data in relation to programmed electrical, mechanical and/or structural aspects of the cells. While nominally non-volatile so that the programmed state is maintained for an extended period of time, memory cells can be subjected to a variety of effects that induce variations (programming drift) in the programmed state. These effects can include read disturb, write disturb, charge drift, temperature degradation, demagnetization, accumulated write/erasure cycles, wear, etc. and can affect the programmed integrity of a cell over time.

It is common to perform a refresh operation upon currently stored data to reprogram the existing cells, or write the data to a new set of cells, before the programming drift has advanced sufficiently to prevent reliable recovery of the programmed data. Some memory cells require an intervening erasure operation prior to rewriting data to the cells. Garbage collection operations can include rewriting current data to new locations followed by the erasure or otherwise resetting of a block of memory in order to return the block of memory to an available allocation pool.

While operable, a problem with current refresh operations (including but not limited to garbage collection operations) is that the rewriting of data, and as necessary the erasure of memory cells, can reduce the overall operational life of the memory cells. Some types of flash memory cells, for example, wear out after as few as about 5,000 write/erasure cycles. Other types of memory cells can experience similar wear sensitivity due to repeated writing and/or erasures.

Write amplification is a related phenomenon associated with solid-state non-volatile memory cells, including flash memory cells. Write amplification generally relates to the total number of times a particular set of data is written within a memory. An ideal write amplification value would be equal to one (1), since optimally a set of data, once received, would only be written once to the memory. In actual practice however, garbage collection and other refresh operations often result in data being migrated, rewritten, copied or otherwise duplicated multiple times within an array. Some current generation solid-state drives (SSDs) exhibit typical write amplification values of three (3) or more, meaning that each set of data received from a host is ultimately rewritten within the memory at least two additional times after having been initially written upon receipt.

As can be appreciated, high levels of write amplification can reduce the operational life of a memory, and can also reduce the ability to accommodate new data if multiple sets of the same data are currently resident in different locations within the memory.

Accordingly, various embodiments of the present disclosure are generally directed to an apparatus and method for managing data in a solid-state non-volatile memory in such a way as to reduce write amplification. As explained below, a block of memory cells are programmed to an initial programming state. One or more of the memory cells are identified as candidates for partial reprogramming as a result of estimated or detected programming drift.

Partial reprogramming is applied to the one or more memory cells by applying relatively small increments of programming effort, such as small increments of charge, to the memory cells to restore the cells to the previously applied programming state. The cells may be marked with a time/date stamp or other indication data to indicate the cells have been reprogrammed. In this way, the overhead time and resources required to migrate data within a memory array can be reduced, and wear upon the memory array due to unnecessary erasures and write operations can be avoided.

In some embodiments, partial reprogramming is carried out in a flash memory environment based on the amount of charge that a flash memory cell has lost over time, as measured by reading applied voltage thresholds or bit error rates of the cell. The cell is then preemptively partially reprogrammed to bring the cell back to its original state. This eliminates the need to copy the data to a new, fresh block and recycle the old block.

The partial reprogramming can be carried out using reduced programming voltages, pulses, etc. Different types of memory cells can be partially reprogrammed including flash memory cells, PCRAM cells, STRAM cells, RRAM cells, etc. In the context of a flash memory cell, substantially just enough electrons are migrated across a floating gate boundary to bring the voltage threshold of the cell back to its originally programmed state.

In further embodiments, a look up table or other mechanism, such as a transfer function, can be used to determine the appropriate remedial programming efforts for a given memory cell. Variables that can affect charge loss in a flash memory cell include temperature, time and program/erase cycles. The device can track these and other variables and schedule the application of the partial reprogramming in the background to maintain programming states within specified population tolerances.

Figure 1:
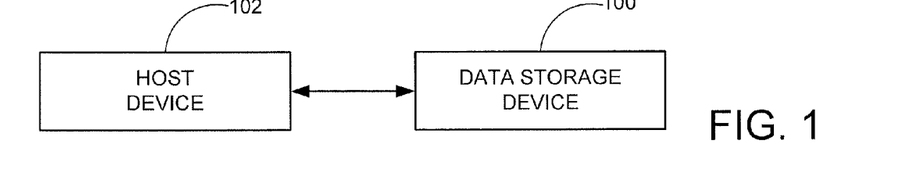
FIG. 1 provides a functional block representation of a data storage device arranged to communicate with a host device in accordance with various embodiments.

These and other features of various embodiments can be understood beginning with a review of FIG. 1 which provides a simplified block diagram of a data handling system featuring a data storage device 100 coupled to a host device 102. The respective storage device 100 and host 102 can take any suitable form. In some embodiments, the host 102 is a network accessible computing device, such as a desktop computer, a server, a portable electronic device, a smart phone, laptop, tablet, a gaming system, etc. The storage device 100 may be incorporated into the host 102, or may be connected to the host locally or via a network to provide volatile and/or non-volatile memory data storage capabilities for the host 102.

Figure 2:
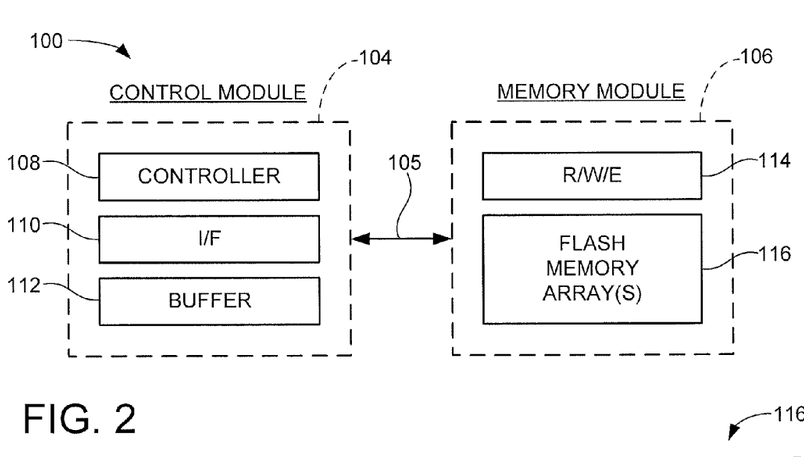
FIG. 2 shows a block diagram representation of the data storage device of FIG. 1 in accordance with some embodiments.

FIG. 2 illustrates an exemplary construction for the storage device 102 of FIG. 1 in accordance with some embodiments. The device 102 includes a control module 104 and a memory module 106. The control module 104 provides top level control for the data handling system, and the memory module 106 provides a main data store. The memory module 106 is adapted to receive, process and execute commands issued to it by the control module 104 across a control/memory module communication interface 105.

The respective modules 104, 106 may take a number of forms. A solid-state drive (SSD) application may incorporate both the control module 104 and the memory module 106 in an integrated, stand-alone assembly. In a hybrid disc drive application, the memory module 106 may include both flash and disc-based memory. A memory card application may incorporate some or all of the control module functionality in the host device 102 (FIG. 1).

The exemplary control module 104 in FIG. 2 is shown to include a controller 108, an interface (I/F) circuit 110 and a memory buffer 112. The controller 108 provides overall control functions for the device 100, including directing transfers of data between the host 102 and the memory module 106. The I/F circuit 108 provides interface communications with the host and with the memory module 106. The buffer 112 can provide a storage location for programming and control data used by the controller 108 as well as temporary storage of data during data access operations. Although not specifically depicted in FIG. 2, the control module 104 may include additional functionality as well, including encryption, error detection and correction, and other signal processing capabilities.

The memory module 106 is shown to include a read/write/erase (R/W/E) circuit 114 and one or more flash memory arrays 116. The R/W/E circuitry 114 operates to perform read, write and erasure functions upon the flash memory arrays 116 responsive to control inputs from the control module 104. While the memory utilizes flash memory, such is merely exemplary and not limiting as any number of different types of solid-state non-volatile memory can be used, including hybrid systems with multiple types of memory (e.g., flash, RRAM, STRAM, PCRAM, etc.).

Figure 3:
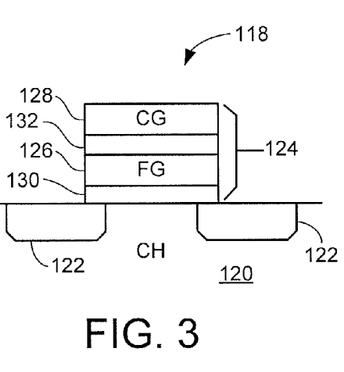
FIG. 3 shows a flash memory cell construction that can be used in the device of FIG. 1.

The flash memory arrays 116 may be formed of individual flash memory cells 118, as generally depicted in FIG. 3. The flash memory cell 118 is formed on a semiconductor substrate 120 having spaced apart n+ doped regions 122. A gate structure 124 spans the pair of adjacent doped regions so that the flash cell takes a general nMOS transistor configuration. Additional flash cells can be formed on the substrate so that each adjacent pair of the doped regions 122 is provided with an associated gate structure 124.

The gate structure 124 provides an alternating stack of electrically conductive gates 126, 128 and electrically insulative regions 130, 132. Data are stored by each cell 118 in relation to the relative amount of electrical charge stored on the lower gate 126, which is characterized as a floating gate (FG).

The floating gate 126 accumulates charge during a programming operation by the selected application of appropriate voltages to the adjacent doped (drain and source) regions 122 and the upper gate 128, which is characterized as a control gate (CG). These applied voltages induce the controlled migration of electrical charge from a channel (CH) portion of the semiconductor substrate 120 to the floating gate 126 across insulative region 130.

In an initial erased state, there will usually be substantially no accumulated charge on the floating gate. In this state, the cell will generally tend to exhibit drain-source conductivity across the channel without the application of voltage to the control gate. Once charge has been accumulated on the floating gate, the drain-source path will be non-conductive unless a sufficiently high gate control voltage is applied to the control gate, at which point the cell becomes conductive. The programmed state of the cell can be determined by observing the level of control gate voltage required to allow drain-source current to pass through the cell, which generally correlates to the amount of accumulated charge on the floating gate.

The cell 118 can be configured as a single-level cell (SLC) or a multi-level cell (MLC). An SLC stores a single bit; a normal convention is to assign the logical bit value of 1 to an erased cell (substantially no accumulated charge) and a logical bit value of 0 to a programmed cell (presence of a selected threshold of accumulated charge). An MLC stores multiple bits, such as two bits. Generally, n bits can be stored using $2^n$ storage states. A normal convention is to assign the multi-bit logical value 11 to an erased cell with charge C0 (substantially no accumulated charge), and then sequentially assign the remaining multi-bit logical values 01, 00 and 10 to increasingly higher charge levels C1, C2 and C3.

A special erasure operation is generally required to remove accumulated charge from the floating gate 126. An erasure can be carried out by the application of a relatively high voltage to the control gate to cause migration of the charge from the floating gate back to the channel. A different set of voltages may be applied to the cell to thereafter add charge to the floating gate during a data write operation.

Figure 4:
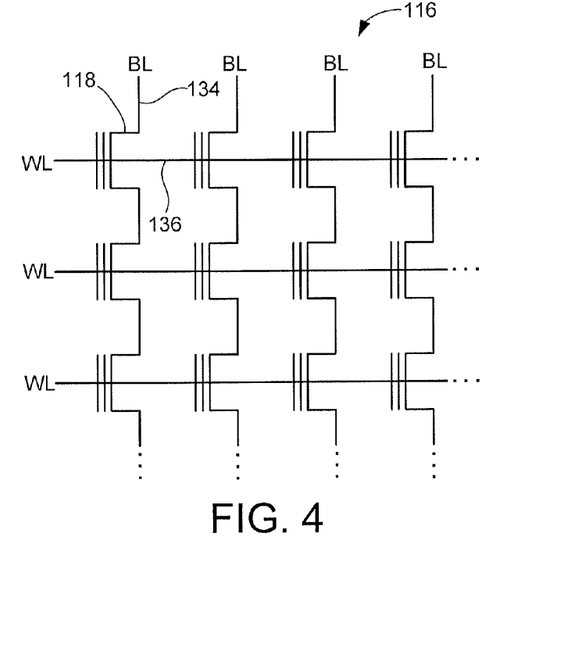
FIG. 4 is a schematic depiction of a portion of a flash memory array using the cells of FIG. 3.

Memory cells such as 118 in FIG. 3 can be arranged in the memory module 106 as an array of rows and columns of memory cells, as generally depicted in FIG. 4. Each column of adjacent cells can be coupled via one or more bit lines (BL) 134. The control gates 128 of the cells 118 along each row can be interconnected via individual word lines (WL) 136.

Figure 5:
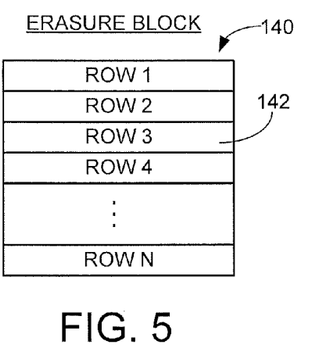
FIG. 5 illustrates an exemplary format for an erasure block.
Figure 6:
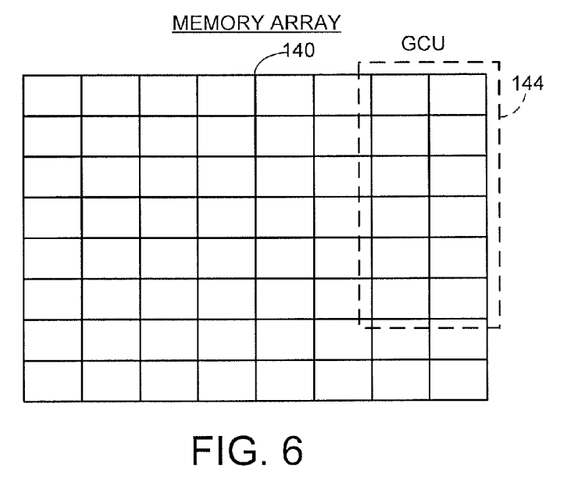
FIG. 6 shows an arrangement of erasure blocks into a garbage collection unit (GCU).

The array of memory cells shown in FIG. 4 may be grouped into erasure blocks 140, as depicted in FIGS. 5 and 6. Each erasure block 140 may be a separately addressable block of memory and represents the smallest unit of memory that can be concurrent erased at a time. Each erasure block 140 may be arranged as a plurality of rows 142 of memory cells, with each row sharing a common word line (FIG. 4) and accommodating the storage of a selected amount of user data. Other internal arrangements and interconnections of cells can be utilized as desired.

Block-level wear leveling may be employed to track the erase and write status of the various blocks 140. New blocks will be allocated for use as required to accommodate newly received data. In some embodiments, groups of blocks 140 may be accumulated into larger garbage collection units (GCUs) 144 which are allocated, used and erased as a unit. GCUs 144 may take any suitable size.

In at least some embodiments, a fixed size set of data, sometimes referred to as a page, is written to each row 142 at a time. The page size may correspond to a logical sector, or multiple user sectors may be incorporated into each page's worth of data. The sectors may each have an associated logical address, such as a logical block address (LBA). Error correction codes such as parity bits or Reed Solomon codes may be incorporated at the page level to correct errors as a full page worth of data is retrieved. Metadata and other control information may be stored in each erasure block 140, or stored elsewhere such as in specific blocks dedicated to this purpose.

Figure 7:
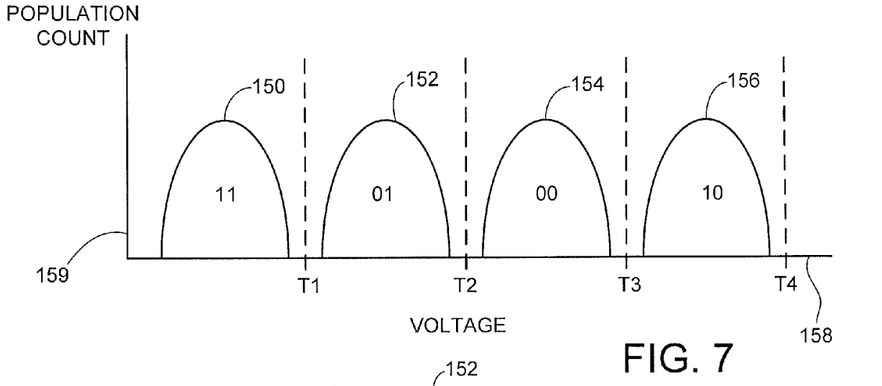
FIG. 7 illustrates charge density populations for memory cells from FIG. 6.

FIG. 7 illustrates exemplary normalized charge distributions 150, 152, 154 and 156 for different levels of charge stored on the various flash memory cells 118 in the array of FIG. 6.

The distributions are plotted against a common x-axis 158 indicative of voltage magnitude and a common y-axis 159 indicative of cell population count.

The distributions 150, 152, 154 and 156 represent variations about nominal accumulated charge states C0<C1<C2<C3, and correspond to MLC programmed states 11, 01, 00 and 10. Other encoding schemes can be used. Distribution 150 represents variation in the amount of charge on the memory cells in the array that have been programmed to the state 11, distribution 152 corresponds to state 01, distribution 154 corresponds to state 00, and distribution 156 corresponds to state 10. The cells in population 156 have the most accumulated charge and the cells in population 150 have the least accumulated charge.

The programmed states 11, 01, 00 and 10 may represent data for two different pages (blocks) of data in each cell. In this case, the least significant bit (LSB) of the programmed state may provide a bit value for a first page, and the most significant bit (MSB) of the programmed state may provide a bit value for a second page.

The respective charge distributions 150-156 are ideally non-overlapping to allow the application of suitable read-threshold voltages T1, T2, T3 and T4 to differentiate between the various programmed states. Threshold T1 nominally provides a voltage level sufficient to place all of the memory cells in distribution 150 into a source-drain conductive state, but insufficient to place the cells in distributions 152, 154 and 156 into a conductive state. The threshold T4 is generally large enough to place all of the cells in a conductive state irrespective of their programmed state.

The programmed state of a selected flash memory cell can be read by placing the bit line 134 (FIG. 4) for the selected cell at a suitable forward voltage (e.g., +3V, etc.), and placing the remaining non-selected bit lines at some other lower reference voltage (e.g., 0V). The non-selected word lines 136 for rows not containing the selected cell can be placed at the highest threshold T4, so that all of the cells in the selected column other than the selected cell are placed in a source-drain conductive state.

One or more read-threshold voltages can be thereafter applied to the WL 136 associated with the selected cell, and the programmed state of the selected cell can be determined in relation to whether current flows through the bit line 134 and the other cells in the selected column. The read operation thus assesses whether a given read-threshold voltage is sufficient to place the selected cell in a conductive state; the higher the applied voltage required to obtain current flow through the column, the higher amount of accumulated charge is present on the floating gate.

In some embodiments, a first page of data is written to the cells along a selected row of cells in SLC mode. The first page of data will constitute a bit sequence of logical 0s and 1s in some order (e.g., 00101111010000100 . . . ). One bit will be stored in each cell. Those cells in which a logical 1 is to be stored may receive no programming effort (or minimal programming effort) so as to have a charge level that falls within the "11" distribution 150. Those cells in which a logical 0 is to be stored will receive sufficient programming effort to raise the charge level to fall within the "00" distribution 154.

To read back the stored bit sequence from the SLCs, the read threshold voltage T2 can be applied to each cell in turn, and the stored state (logical 1 or 0) can be determined in relation to whether the cell is placed into a conductive state as a result of the applied read threshold voltage.

A second page of data may be subsequently overwritten to the SLC cells to convert the cells into MLC form. As before, the second page of data will constitute a bit sequence of logical 0s and 1s, and one bit from the second page of data will be stored to each cell. Those cells to which a logical 1 is to be stored will receive no additional programmed effort. Those cells to which a logical 0 is to be stored will receive sufficient additional charge to increment the charge level to the next higher distribution.

If a logical 1 is to be written to a memory cell programmed in the "11" distribution 150, the additional charge will transition the cell to the "01" distribution 152. Similarly, if a logical 1 is to be written to a memory cell programmed in the "00" distribution 154, the additional charge will transition the cell to the "10" distribution 156. In each case, the LSB of the programmed cell (rightmost bit) indicates the bit value for the first page of data and the MSB of the programmed cell (leftmost bit) indicates the bit value for the second page of data.

Ideally, the respective populations 150-156 maintain sufficient separation to enable the various thresholds T1-T4 to correctly discern the programmed states of the cells. However, over time a variety of effects such as wear, read disturb, write disturb, temperature, charge drift, manufacturing tolerances, etc. can cause cells within a given population to drift, such as depicted by the dotted line shifted representations of population 152 in FIG. 8. It can be seen that some of the memory cells in the shifted populations 152 will be detected as storing the programmed state 11 rather than the actual programmed state 01. Charge drift can result in increases or decreases in the total amount of accumulated charge, so that a population shift to the right in FIG. 8 can occur as well.

Figure 8:
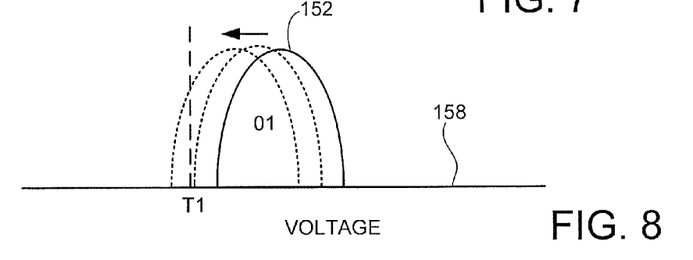
FIG. 8 illustrates charge drift in a selected population from FIG. 7.
Figure 9:
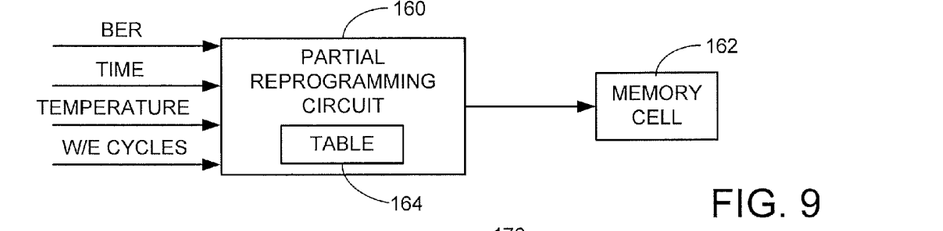
FIG. 9 is a partial reprogramming circuit of the data storage device that operates in accordance with various embodiments to correct the charge drift of FIG. 8.

FIG. 9 illustrates a partial reprogramming circuit 160 operable in accordance with various embodiments to correct programming drift in a memory cell 162. The programming drift may be in the form of charge drift as illustrated in FIG. 8 for a flash memory cell. Alternatively, the memory cell may take a different form such as a PCRAM cell, an RRAM cell, an STRAM cell, etc. and programming drift may be in the form of phase change drift, resistance drift, demagnetization, etc.

The partial reprogramming circuit 160 applies reprogramming efforts to the memory cell 162 to restore the cell to a previously programmed state. The reprogramming efforts are less than a normal programming effort in terms of time, pulse width, charge transfer amount, applied field strength, etc. In this way, the circuit 160 "tweaks" the existing programming state to tighten the programming distribution.

In some embodiments, the partial reprogramming circuit 160 forms a portion of the controller 108 or the read/write/erasure (R/W/E) circuit 114, or is a stand-alone circuit that interfaces with these other circuits. The circuit 160 may employ a number of control inputs including detected or estimated bit error rates (BERs), time information, temperature measurements, accumulated write/erasure (W/E) counts, etc. to identify candidate memory cells to which reprogramming efforts should be applied. A lookup table 164 can store profile information to be used to enable the circuit 160 to reprogram a particular cell under various environmental conditions or circumstances.

Figure 10:
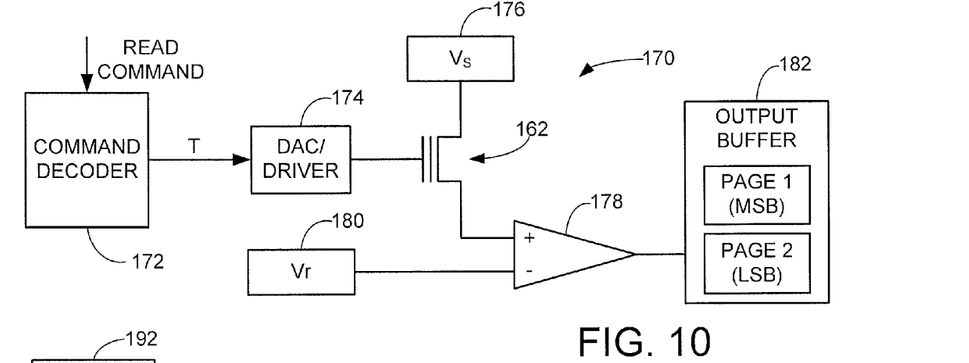
FIG. 10 is a read portion of a read/write/erasure circuit of the data storage device.

FIG. 10 shows a read portion 170 of the read/write/erasure circuitry 114 of FIG. 2 operable to read two pages (blocks) of data from a group of MLCs, such as along a selected row. A command decoder block 172 processes a read command and outputs one or more digital read threshold values T to a digital-to-analog (DAC)/driver circuit 174. The DAC/driver 174 outputs a corresponding analog gate voltage to each cell in turn (represented by the memory cell 162 from FIG. 9). A source voltage $V_s$ is applied by source 176. The conductive state of the cell is sensed using a comparator 178 and a suitable reference voltage Vr from source 180. The sensed data are provided to an output buffer 182 which separately stores the stored data (Page 1 and Page 2, respectively).

Multiple thresholds may be required to sense the storage state of each cell. The voltage threshold T2 can be initially applied to sense the storage state of the MSB Page 1 data. The voltage thresholds T1 and T3 may be subsequently applied to sense the storage state of the LSB Page 2 data. If the threshold T2 rendered the cell conductive, T1 may be subsequently applied to determine whether the cell falls within populations 150 or 152. Similarly, if the threshold T2 failed to place the cell in a conductive state, application of T3 will determine whether the cell falls within populations 154 or 156.

The storage state 11, 01, 00 or 10 can thus be easily determined, with the first (MSB) bit indicating a bit in the first page and the second (LSB) bit indicating a bit in the second page. Repeating the above steps for each MLC in turn will produce the recovered bit sequences for the first and second pages.

Figure 11:
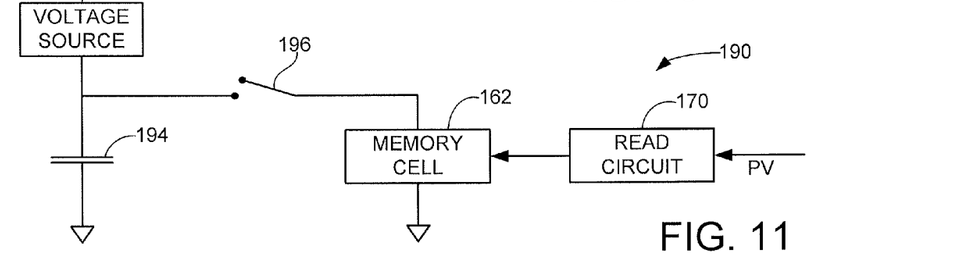
FIG. 11 is a write portion of a read/write/erasure circuit.

Programming of the cells can be carried out by a write circuit portion 190 of the read/write/erasure circuitry 114, as illustrated in FIG. 11. A charge pump arrangement is used whereby discrete quanta of accumulated charge are sequentially transferred to the selected cell 162 to raise the total accumulated amount of charge to the desired programming distribution.

A voltage source 192 supplies a programming voltage to a capacitor 194 or other charge storage element. A selectively activated switch 196, which may take the form of a power MOSFET or other suitable device, periodically closes to allow the transfer of the accumulated charge from the capacitor 194 to the selected memory cell 162.

The read circuit 170 from FIG. 10 can be used to periodically apply one of several program verify (PV) read threshold voltages to the cell during the accumulation of charge. In some embodiments, the program processing of FIG. 11 continues until the cell 162 no longer becomes conductive responsive to the specified PV read threshold value, at which point the programming operation on the selected cell is terminated.

Figure 12:
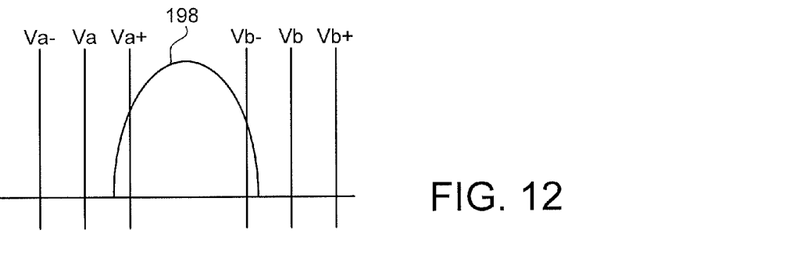
FIG. 12 shows application of different voltage sense thresholds to a population of memory cells to assess programming drift.

FIG. 12 provides another population curve 198 for a population of programmed memory cells. A series of voltage thresholds can be applied to determine the size and shape of the population. As shown in FIG. 12, a lower baseline threshold Va can be applied along with incremented thresholds (Va−, Va+) which may be slightly lower and higher than the baseline threshold (e.g., +/−5%, etc.) to characterize the lower boundary of the population curve 198. Similarly, a higher baseline threshold Vb and associated incremented thresholds Vb−, Vb+ can be applied to characterize the upper boundary of the population curve 198.

Figure 13:
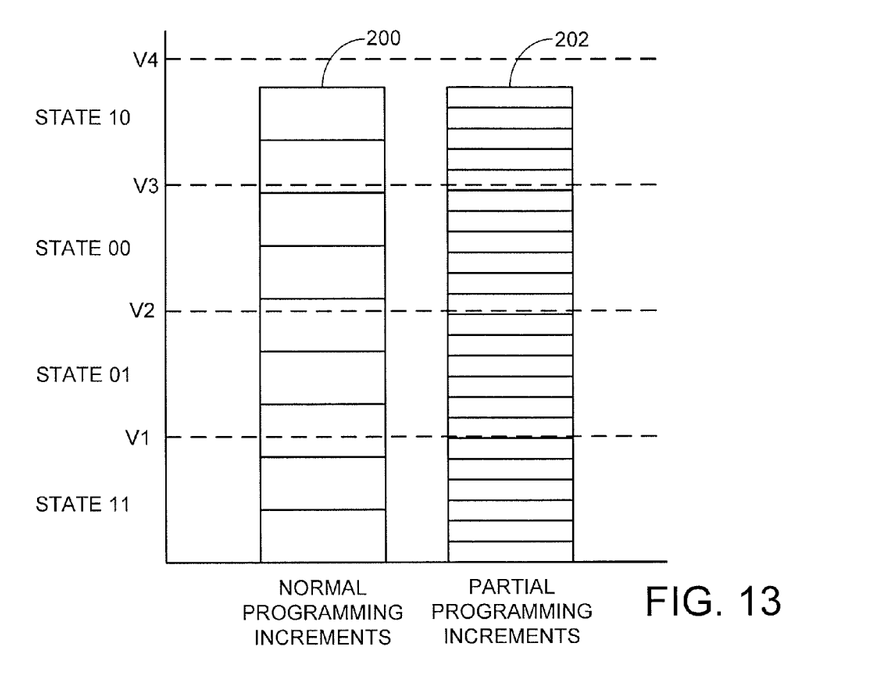
FIG. 13 illustrates normal programming increments and partial programming increments applied by the write portion of FIG. 11 during normal programming and partial programming operations, respectively.

FIG. 13 illustrates different sizes of programming increments that can be applied by the write circuit 190 of FIG. 11 and sensed by the read circuit 170 of FIG. 10 during normal programming and partial programming efforts. Relatively larger programming increments of accumulated charge 200 may be applied by the write circuit 190 to program a memory cell to an initial state, and then relatively smaller reprogramming increments of accumulated charge 202 may be subsequently applied by the write circuit 190 to return the cell to the initially programmed state.

For example, with reference again to FIG. 7 an erased memory cell with an initial programmed state of 11 may be programmed to the 00 state by being subjected to five or six (5-6) of the increments 200 in order to bring the total amount of accumulated charge up to a level that is between the threshold values set by voltages V2 and V3.

Thereafter, as charge leaks from the floating gate of the memory cell and the total amount of charge drifts in a direction toward the V2 threshold, one or more of the relatively smaller partial programming increments 202 of accumulated charge can be applied to bring the memory cell back to its previously programmed state (e.g., to a state in which the total amount of accumulated charge is nominally the same as before).

Figure 14:
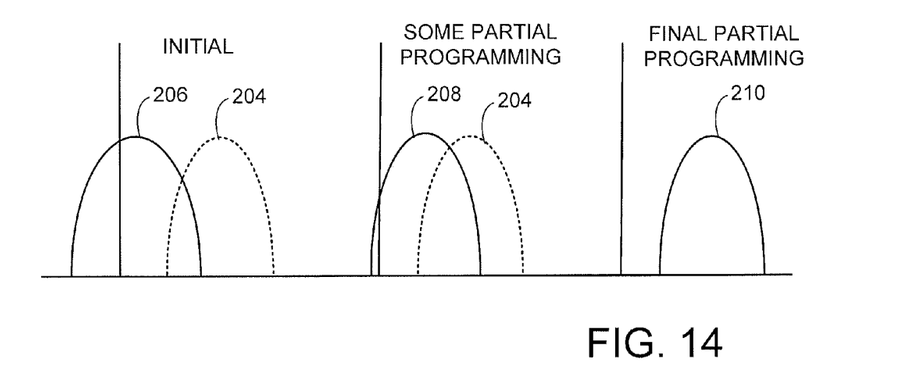
FIG. 14 is a partial programming sequence.

This partial programming sequence is illustrated by FIG. 14. An initial population of cells is programmed to a particular state, as indicated by population distribution curve 204. Over time, at least some of the cells lose charge and provide a drifted population distribution as represented by curve 206.

The application of partial programming increments 202 causes an increase in the overall distribution, as represented by curve 208. As the increments 202 continue to applied, the final partial programming distribution (curve 210) will nominally match the original curve 204.

By partially reprogramming the memory cells in FIG. 14, a full cycle of erase and programming can be avoided, thereby reducing wear on the cells as well as reducing the total number of copies of the data within the memory module.

Figure 15:
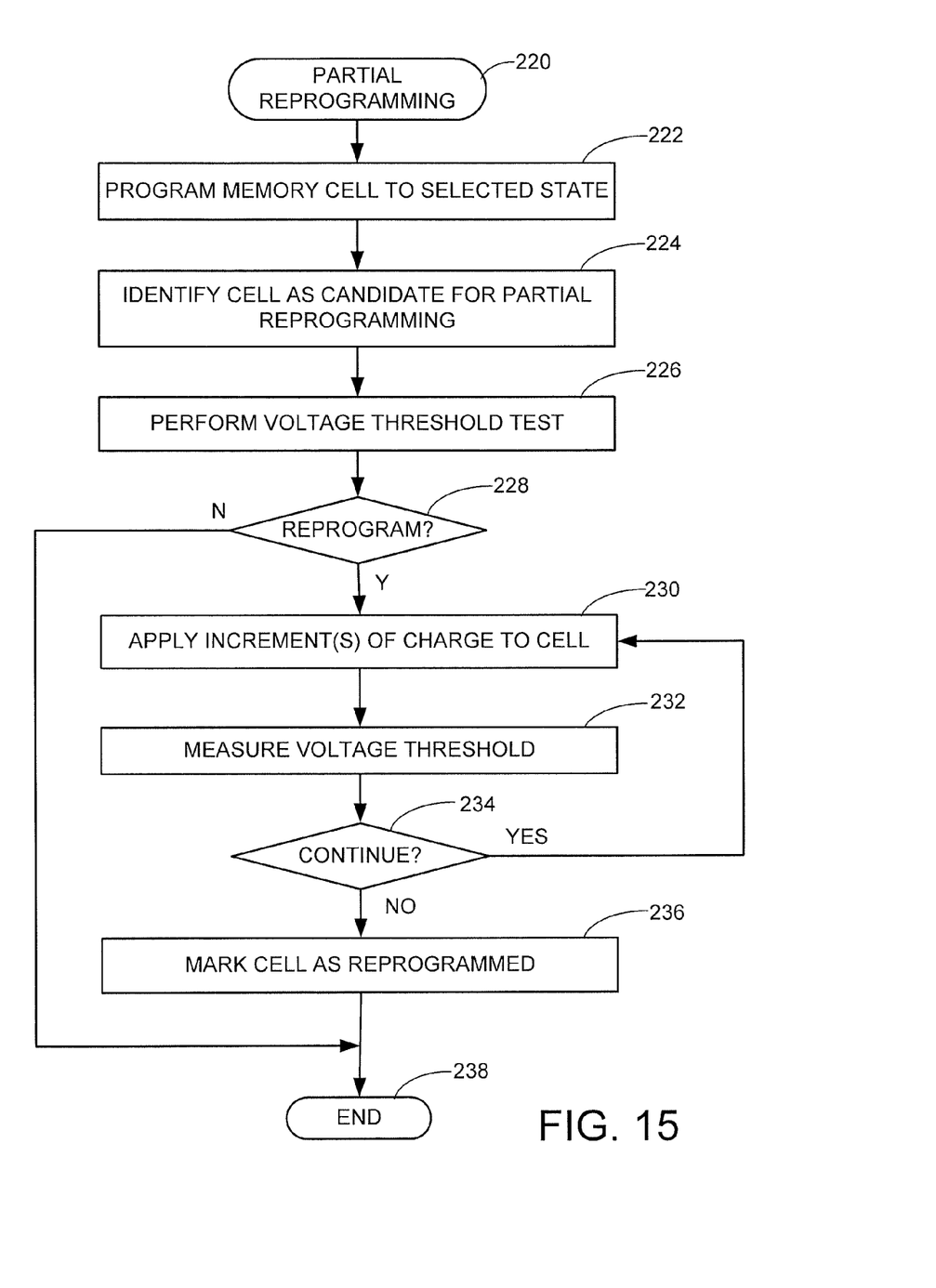
FIG. 15 is a flow chart for a partial programming routine in accordance with some embodiments.

FIG. 15 is a flow chart for a PARTIAL REPROGRAMMING routine 220 to set forth steps carried out in accordance with various embodiments. For purposes of illustration, the routine 220 will be described for a flash memory array as illustrated in FIGS. 2-6. Such is merely exemplary and not limiting.

A memory cell is programmed to a selected state at step 222. This may be an SLC state or an MLC state so that the programmed state corresponds to a single page of data or multiple pages of data, as desired. The programmed state may be a selected one of the states represented in the distribution curves of FIG. 7 (e.g., 11, 01, 00 or 10). After some selected interval of time, the cell is identified as a candidate for partial reprogramming at step 224. This can be carried out in a variety of ways. A retention time for the memory cell can be calculated as an elapsed period of time during which the cell may be able to maintain the programmed state without undue degradation. The cell may be marked as a candidate for partial reprogramming if the actual time that the cell has maintained its programmed state equals or exceeds the calculated retention time.

Alternatively, the cell may be subjected to a read operation and the bit error rate (BER) for the block(s) of memory that include the cell may exceed a predetermined threshold. In other embodiments, the write/erasure counts for the block may reach a particular threshold that indicates that the cell should be evaluated. In still other embodiments, a sufficiently high number of read operations to the cell and/or to adjacent cells has been achieved to indicate the possibility of read disturbed data. Any other suitable factors, parameters, measurements or other indicia can be used to identify the cell as a candidate for partial reprogramming, including periodic reprogramming of all cells on a scheduled basis.

A voltage threshold test is next performed at step 226 upon the selected memory cell. This can include the application of one or more voltage thresholds, such as depicted in FIG. 12, to ascertain the programmed state of the cell.

If the cell shows sufficient programming degradation, the routine passes from decision step 228 to step 230 where one or more increments of charge are applied to the cell. This can include the application of a small increment 202 from FIG. 13 using the circuitry 190 of FIG. 11, followed by the application of a suitable read/program verify voltage threshold by the circuit 180 of FIG. 12 as indicated at step 232. The process continues as indicated by decision step 234 until the cell has been restored to the appropriate level. The cell is thereafter marked as having been reprogrammed at step 236. This can include a notation in the associated metadata for the memory cell, and may include a date/time stamp to indicate when the cell was reprogrammed. The routine then ends at step 238.

It can be seen that the application of partial reprogramming as set forth herein can reduce the incidence of data rewrites and erasures. Garbage collection operations can still be carried out as required, but on the basis that the data in a given GCU are largely stale (that is, out of revision), rather than in need of data refresh (that is, sufficiently old to have undergone programming drift).

Not every cell is necessarily reprogrammed out of an initial set of programmed cells. Rather, those cells exhibiting bit errors can be subjected to evaluation and programming and the rest can be left alone. Similarly, those cells having programming states more likely to experience program drift (e.g., cells programmed to "10", etc.) may be partially reprogrammed and the rest can be left alone. In other cases, all of the cells in a row of memory cells are evaluated for programming drift and the X worst percent (e.g., worst 20%, etc.) are partially reprogrammed and the rest are left alone.

While the various embodiments disclosed herein associated with flash memory cells have contemplated a reduction in charge level as the drift mechanism, it is contemplated that in some circumstances an increase in charge may be experienced, such as in the context of excessive reads. It is possible to configure the write circuit such that a different set of programming voltages are applied so that a small portion of charge is removed from the floating gate, rather than an additional amount of charge being added to the gate. Similarly, bi-directional programming adjustments for other types of memory cells can be applied as well.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising
writing data to a row of solid-state non-volatile memory cells in a memory so that each memory cell in the row is written to an associated initial programmed state using a respective sequence of multiple write pulses, each write pulse in the respective sequence transferring no less than a minimum increment of accumulated charge;
performing a read operation to read back and transfer, to a host device, the data written to the row of memory cells by applying at least one voltage threshold to the memory cells in the row to detect the initial programmed states of the memory cells;
detecting drift in the programmed state of a selected memory cell in the row after the read operation; and
partially reprogramming the selected memory cell to return the selected memory cell to the associated initial programmed state responsive to the drift in the programmed state detected during the detecting step using a second sequence of write pulses, each write pulse in the second sequence transferring a second increment of accumulated charge at least 50% less than the minimum increment of accumulated charge.

2. The method of claim 1, wherein the detecting step detects drift in each of the memory cells along the row and the partially reprogramming step applies partial reprogramming using a different second sequence of the write pulses to a predetermined percentage of the memory cells along the row less than 100% thereof exhibiting a greatest amount of charge drift among the memory cells along the row.

3. The method of claim 2, wherein each of the flash memory cells is configured as a multi-level cell (MLC) so that two pages worth of data are stored by the memory cells.

4. The method of claim 2, wherein the predetermined percentage is nominally 20% of the memory cells along the row.

5. The method of claim 1, wherein the drift in the programmed state is detected by applying a voltage threshold to the selected memory cell.

6. The method of claim 1, wherein the drift in the programmed state is detected responsive to a bit error rate (BER) associated with the selected memory cell during the read operation.

7. The method of claim 1, wherein the drift in the programmed state is detected responsive to an elapsed time since the selected memory cell was programmed to the associated initial programmed state.

8. The method of claim 1, wherein the drift in the programmed state is detected responsive to a temperature measurement associated with the selected memory cell.

9. The method of claim 1, wherein multiple increments of charge are applied to program the selected memory cell to the initial programmed state each nominally equal to the minimum increment of accumulated charge, and wherein multiple smaller increments of charge are subsequently applied to partially reprogram the selected memory cell back to the initial programmed state.

10. The method of claim 1, wherein the memory cell is a selected one of a resistive random access memory (RRAM) cell, a phase change random access memory (PCRAM) cell or a spin-torque transfer random access memory (STRAM) cell.

11. The method of claim 1, further comprising marking the selected memory cell as having been reprogrammed in control data associated with the selected memory cell by setting a flag value in a memory location.

12. An apparatus comprising:
an array of solid-state non-volatile memory cells arranged into addressable units;
a write circuit configured to write data to a selected addressable unit of memory so that each memory cell in the selected addressable unit has an associated initial programmed state by applying programming pulses each nominally having a first charge increment;
a read circuit configured to subsequently read the data written to the selected addressable unit of memory during a read operation by detecting the associated initial programmed state of each memory cell therein, the read circuit further configured to transfer the data read from the selected addressable unit of memory to a host device; and
a partial reprogramming circuit configured to detect drift in the programmed state of memory cells in the selected addressable unit after the read operation and to direct the write circuit to partially reprogram all of the memory cells in the selected addressable unit having a selected one of the associated initial programmed states determined to be most susceptible to programming drift, remaining memory cells in the selected addressable unit programmed to remaining ones of the associated initial programmed states not being partially reprogrammed responsive to the detected drift, the partial reprogramming circuit directing the write circuit to partially reprogram the memory cells using programming pulses each nominally having a second charge increment less than the first charge increment.

13. The apparatus of claim 12, wherein the selected addressable unit is a row of flash memory cells, wherein the write circuit accumulates and transfers first increments of charge to the flash memory cells to write a page of data to the row, and the write circuit accumulates and transfers second increments of charge smaller than the first increments of charge to partially reprogram the flash memory cells of the row.

14. The apparatus of claim 12, wherein a first write pulse duration is applied to program each memory cell to the associated initial programmed state, and a second write pulse duration is subsequently applied to reprogram a selected memory cell to its associated programmed state, the second write pulse duration shorter than the first write pulse duration.

15. The apparatus of claim 12, wherein the drift in the programmed state is detected by applying a voltage threshold to a selected memory cell.

16. An apparatus comprising:
a flash memory array comprising non-volatile flash memory cells arranged into a plurality of garbage collection units (GCUs) which are erased and allocated as a unit;
a read/write/erasure (R/W/E) circuit adapted to respectively read data from a selected GCU, write data to the selected GCU and to erase the selected GCU; and
a partial reprogramming circuit which identifies a set of programmed flash memory cells in the selected GCU as having experienced programming drift, and which directs the R/W/E circuit to partially reprogram less than all of the set of programmed flash memory cells by transferring electrical charge thereto to restore the memory cells to their initially programmed states without application of an intervening erasure of the selected GCU, the partial reprogramming circuit directing the R/W/E circuit to apply programming pulses each having a first charge increment to initially program the memory cells to respective initial program states that are subsequently read by the R/W/E circuit to transfer associated data to a host device, and the partial reprogramming circuit directing the R/W/E circuit to apply partial programming pulses each having a smaller, second charge increment to restore the memory cells to their initially programmed states.

17. The apparatus of claim 16, wherein the partial reprogramming circuit further directs the R/W/E circuit to apply one or more voltage thresholds to the set of programmed flash memory cells to assess a programmed state of each prior to the partial reprogramming operation.

18. The apparatus of claim 16, wherein the less than all of the set of programmed flash memory cells partially reprogrammed by the R/W/E circuit each have a common program state.

19. The apparatus of claim 16, wherein the less than all of the set of programmed flash memory cells partially reprogrammed by the R/W/E circuit represent X % of the set of programmed flash memory cells having a worst amount of programming drift, where X is a number less than 100.

20. The apparatus of claim 16, wherein the R/W/E circuit writes data to each of the memory cells using a respective sequence of write pulses, each write pulse in the respective sequence transferring no less than a minimum increment of accumulated charge, and wherein the R/W/E circuit performs the partially reprogram operation using a second sequence of write pulses, each write pulse in the second sequence transferring a second increment of accumulated charge at least 50% less than the minimum increment of accumulated charge.

* * * * *